(12) United States Patent
Kim

(10) Patent No.: US 9,506,954 B2
(45) Date of Patent: Nov. 29, 2016

(54) EXTENDED CURRENT DETECTING METHOD FOR CONTROLLING THREE-PHASE MOTOR IN EVENT OF EMERGENCY BRAKE

(71) Applicant: HYUNDAI MOBIS CO., LTD., Seoul (KR)

(72) Inventor: Do Kun Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 14/726,089

(22) Filed: May 29, 2015

(65) Prior Publication Data

US 2016/0049888 A1 Feb. 18, 2016

(30) Foreign Application Priority Data

Aug. 18, 2014 (KR) ........................ 10-2014-0107015

(51) Int. Cl.
| | | |
|---|---|---|
| *H02P 3/04* | (2006.01) | |
| *G01R 19/00* | (2006.01) | |
| *B60L 3/00* | (2006.01) | |
| *B60T 8/171* | (2006.01) | |
| *B60T 8/88* | (2006.01) | |
| *B60T 13/66* | (2006.01) | |
| *B60T 17/18* | (2006.01) | |
| *B60T 17/22* | (2006.01) | |

(52) U.S. Cl.
CPC ............. *G01R 19/00* (2013.01); *B60L 3/0076* (2013.01); *B60T 8/171* (2013.01); *B60T 8/885* (2013.01); *B60T 13/662* (2013.01); *B60T 17/18* (2013.01); *B60T 17/221* (2013.01); *B60T 2270/406* (2013.01)

(58) Field of Classification Search
CPC .............. H02P 3/18; H02P 3/00; H02P 3/04; H02P 3/08; B60T 13/00; B60T 13/66; B60T 8/42; B60T 13/74; B60T 8/00; H02K 7/10; H02K 17/32

USPC ....... 318/362, 370, 371, 372, 374, 375, 376, 318/63, 87, 400.01, 400.14, 400.15, 400.22, 318/703, 727, 741, 742, 757, 759, 761, 765, 318/801, 823, 258, 261, 269, 430, 432; 180/275, 370; 188/4 B, 72.1, 73.33, 188/79.55, 271, 361

See application file for complete search history.

(56) References Cited

U.S. PATENT DOCUMENTS

| | | | | |
|---|---|---|---|---|
| 6,749,269 | B1 * | 6/2004 | Niwa .................... | B60T 13/741 303/115.2 |
| 8,886,433 | B2 * | 11/2014 | Konishi ................. | B60T 8/885 318/362 |

FOREIGN PATENT DOCUMENTS

KR    10-2012-0003529 A    1/2012

*Primary Examiner* — Antony M Paul
(74) *Attorney, Agent, or Firm* — Knobbe Martens Olson & Bear LLP

(57) ABSTRACT

Disclosed is a method, including: urgently putting a brake on a vehicle; detecting current values for at least two phases among phases of a motor which operates at a current which is out of a current measurable range through the urgently putting of a brake; comparing the current value detected in the detecting with a threshold value; when it is determined that there is one current value which is equal to or higher than the threshold value among the detected current values in the comparing, removing the current value which is equal to or higher than the threshold value and obtaining a current value for the remaining phase of the motor from a predetermined look-up table; and determining the removed current value using a current value which is detected through the comparing and is lower than the threshold value and the current value obtained through the obtaining.

3 Claims, 6 Drawing Sheets

EXTENDED CURRENT DETECTING METHOD FOR CONTROLLING THREE-PHASE MOTOR IN EVENT OF EMERGENCY BRAKE

CROSS-REFERENCE TO RELATED APPLICATIONS

This application claims priority to and the benefit of Korean Patent Application No. 10-2014-0107015 filed in the Korean Intellectual Property Office on Aug. 18, 2014, the entire contents of which are incorporated herein by reference.

TECHNICAL FIELD

The present disclosure relates to a motor controlling method, and particularly, to a method for controlling a in the event of employing an emergency brake.

BACKGROUND ART

Generally, a vehicle brake device pressurizes a disk which rotates together with a wheel using a pad from both sides to put a brake on the vehicle by frictional force. A braking force required in this case is generally generated by pressure which is supplied from a hydraulic system to wheels of the vehicle. However, in recent years, an electronic brake device which generates the braking force by a rotational force of an electric motor has been developed.

The electronic brake device is actively being developed because, due to a high response speed of a motor, a torque of the motor is accurately recognized by a current sensor and thus brake force of individual wheels may be controlled, and when the electronic brake device is applied to an anti-lock brake system (ABS), a traction control system (TCS) and an electronic stability program (ESP), the accuracy is high.

Korean Unexamined Patent Application Publication No. 2012-0003529 discloses a method for controlling the electronic brake device of a vehicle.

SUMMARY

One aspect of the present invention provides an extended current detecting method for controlling a three-phase motor in the event of employing an emergency brake, which detects current which flows into each phase of a three-phase motor based on an electric angle of the three-phase motor when a current which is equal to or higher than a current range to be detected by a current sensor temporally flows in the three-phase motor at the time of high speed control such as the emergency brake, in an electronic brake system which uses a three-phase motor.

An embodiment of the present invention provides an extended current detecting method for controlling a three-phase motor at the event of employing an emergency brake including detecting current values for at least two phases among phases of a motor which operates at a current that is out of a current measurable range; comparing the detected current value with a threshold value; and when there is one current value which is equal to or higher than the threshold value among the detected current values in the comparing, removing the current value and obtaining a current value for the remaining phase of the motor from a predetermined look-up table to determine the removed current value.

In the determining, the removed current value may be determined in accordance with the Kirchhoff current law using current values for two phases among phases of the motor.

The method may further include: when all the detected current values are equal to or higher than the threshold value in the comparing, adding an average of current values of a previous period to the detected current values and setting a current value of the remaining phase of the motor to be zero.

The method may further include: when all the current values detected in the detecting is lower than the threshold value, determining the current value of the remaining phase of the three-phase motor in accordance with the Kirchhoff current law.

In the detecting, the current values of individual phases of the motor may be detected based on an electric angle of a rotor of the motor.

In the look-up table, current values of individual phases of the motor may be defined for every electric angle of the rotor of the motor.

The method may further include: checking errors of a current and a pressure of the three-phase motor.

The current may be generated by a requested braking force of a user, but may not be out of a current measurable range of a current sensor which detects the current. According to the extended current detecting method for controlling a three-phase motor in the event of employing an emergency brake according to the embodiment of the present invention, it is possible to temporally control the three-phase motor through higher current in a section where a quick response is required, such as emergency control, to improve a braking performance of the electronic brake system.

A current which is out of a limited detecting range of the current sensor may be detected by simply changing software and the three-phase motor is controlled therethrough, so that an economic advantage may be achieved.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
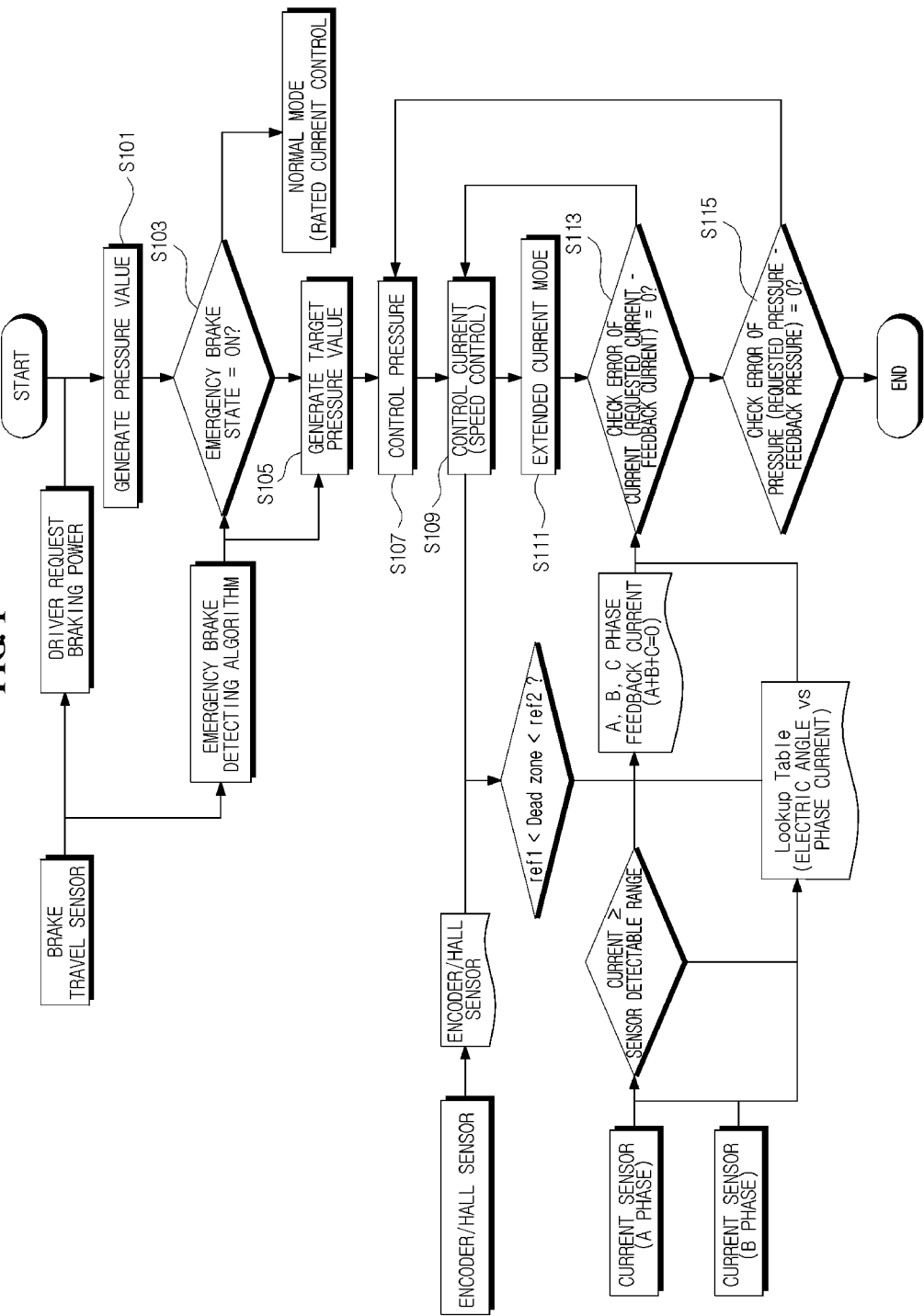
FIG. 1 is a flowchart simply illustrating an extended current detecting method for controlling a three-phase motor in the event of employing an emergency brake according to an embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

In order to sufficiently understand features of the present invention, and the operational advantages of the present invention, the accompanying drawings illustrating embodiments of the present invention and the contents described therein need to be referred to.

Hereinafter, the present invention will be described in detail by explaining embodiments of the present invention with reference to the accompanying drawings. However, the present invention can be realized in various different forms, and is not limited to the embodiments described herein. In order to clearly describe the present invention, a part which may obscure the present invention may be omitted and like reference numerals denote like components.

In the specification, unless explicitly described to the contrary, the word "comprise" and variations such as "comprises" or "comprising" will be understood to imply the inclusion of stated elements but not the exclusion of any other elements. In addition, the terms "unit", "-er", "-or", "module", and "block" described in the specification mean units for processing at least one function and operation and can be implemented by hardware components or software components and combinations thereof.

When a three-phase winding permanent magnet synchronous motor is used, an electronic brake device needs to detect a three-phase current in order to control the three-phase motor. Only two current sensors are generally used to detect the three-phase current by applying a Kirchhoff current equation. That is, only two current sensors are used to detect current for two phases and the remaining phase may be obtained by calculation. In this case, a range of a current which is detected in any one phase of the three-phase motor by the current sensor is limited due to a capacity (for example, 150 A) of the current sensor. For example, when 150 A or higher current flows in any one phase of the three-phase motor, the current sensor detects all the current of 150 A or higher as 150 A, that is, as a saturated current value. Accordingly, electronic braking system can be controlled only within a current range up to 150 A in −150 A, when the current which is out of the current range applied to the three-phase motor, due to the saturation of the current sensor output, electronic braking system would not properly control the three-phase motor.

Figure 2A:
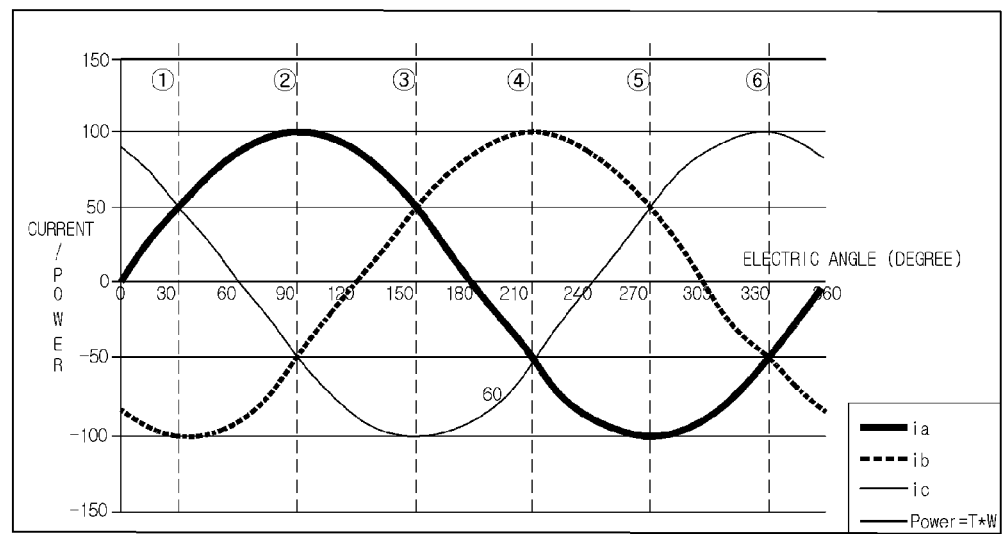
FIGS. 2A and 2B are views illustrating a current which flows in a three-phase motor in accordance with a brake situation according to an embodiment of the present invention.
Figure 2B:
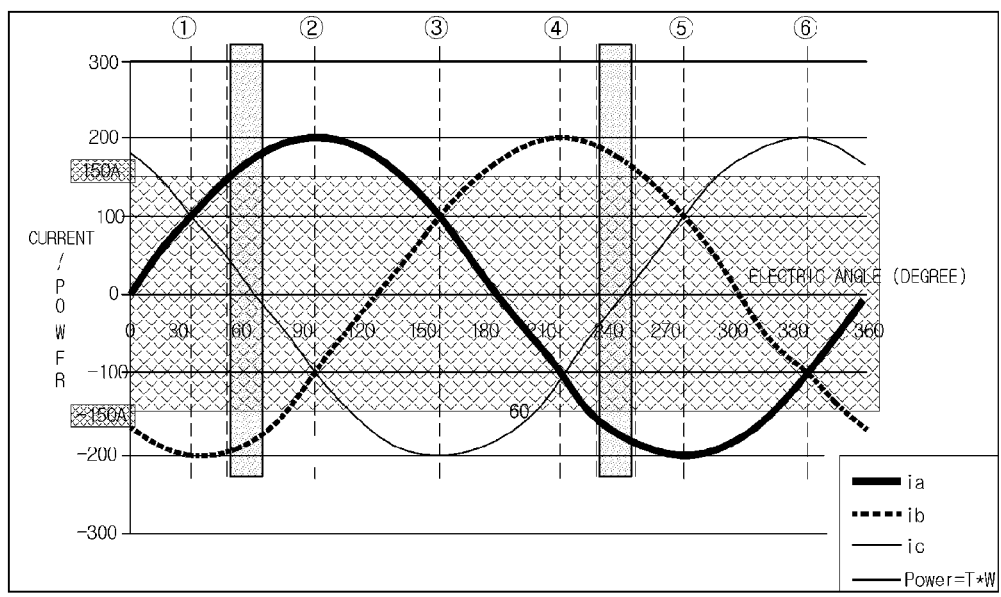
Figure 3A:
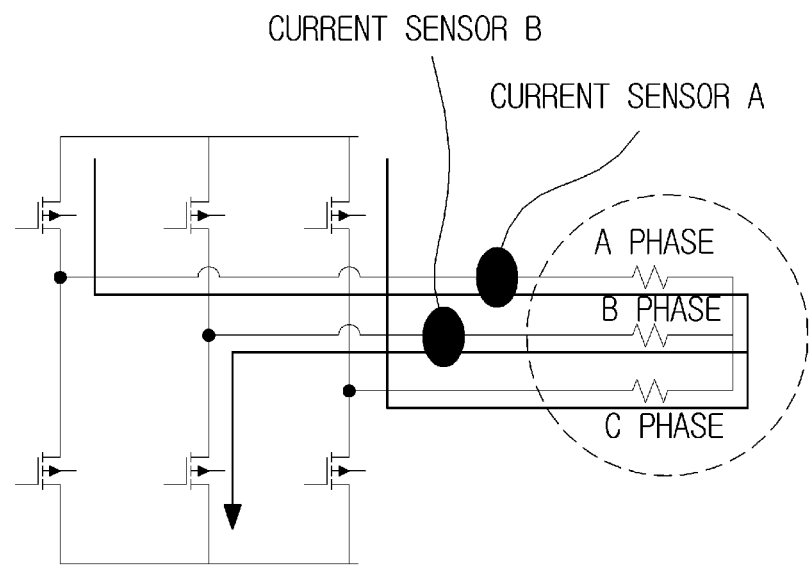
FIGS. 3A to 3F are views illustrating flowing of current in accordance with motor switching according to an embodiment of the present invention.
Figure 3B:
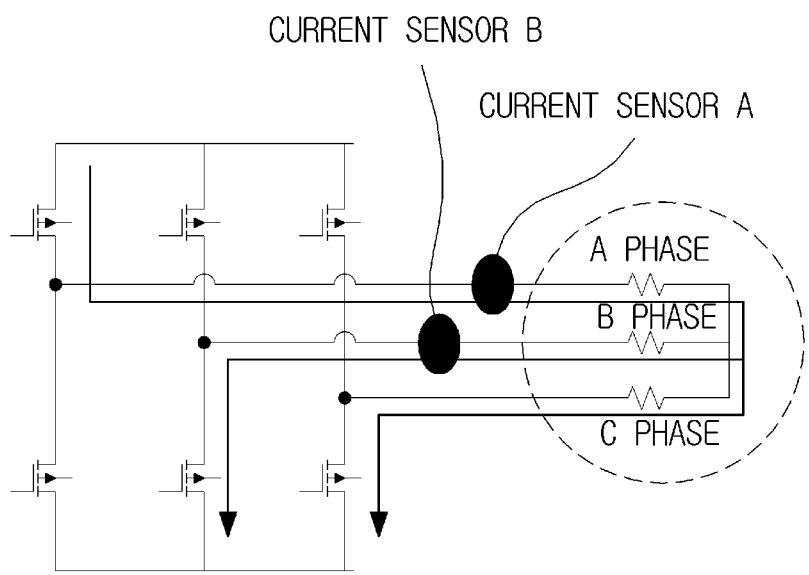
Figure 3C:
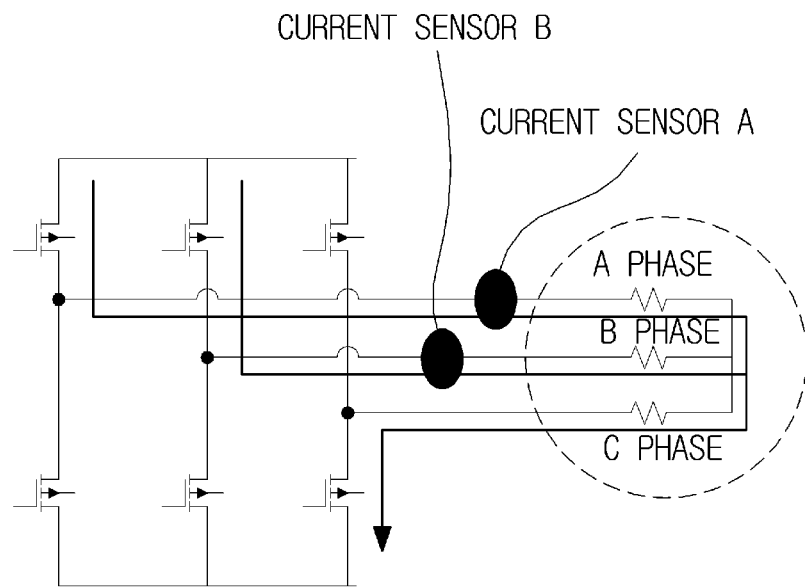
Figure 3D:
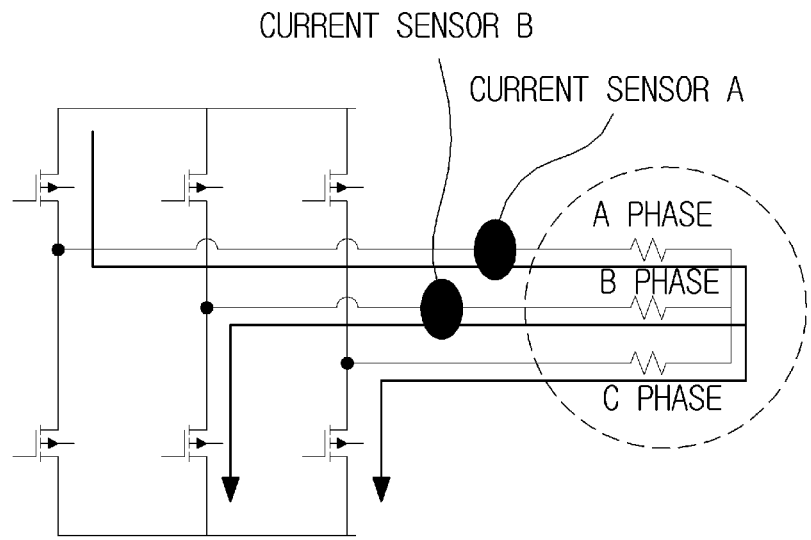
Figure 3E:
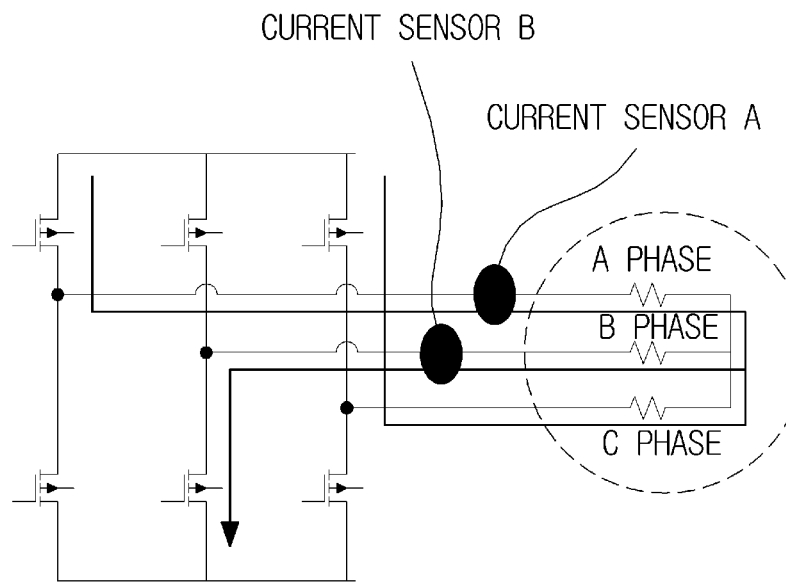
Figure 3F:
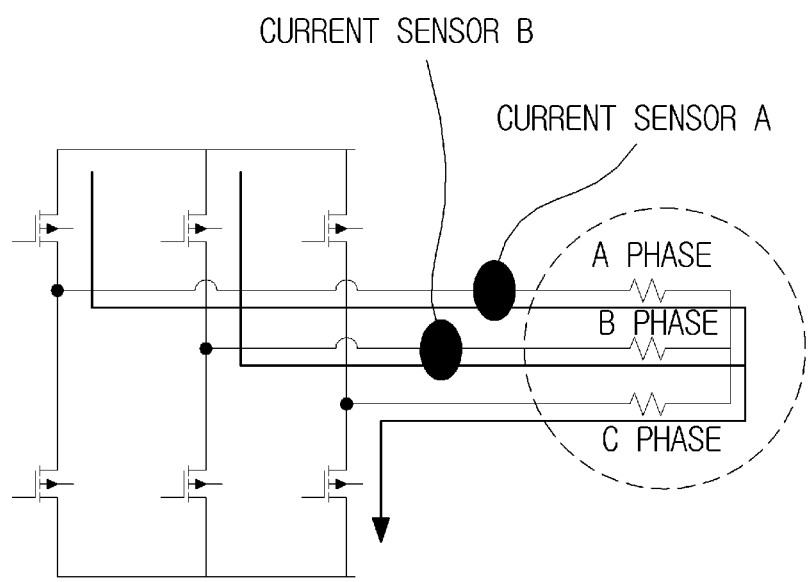
Figure 4:
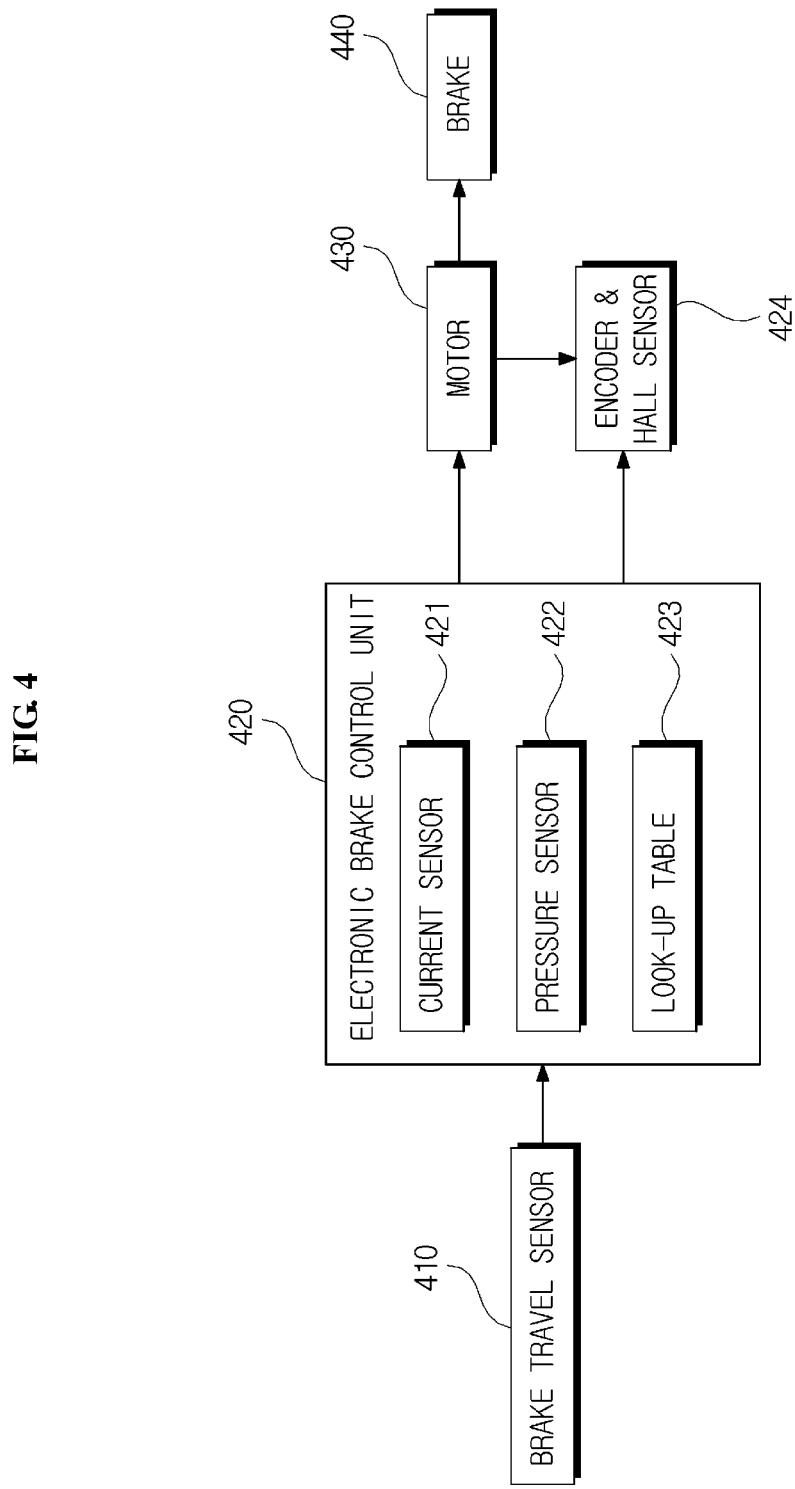
FIG. 4 is a block diagram simply illustrating an extended current detecting apparatus for controlling a three-phase motor in the event of employing an emergency brake according to an embodiment of the present invention.

FIG. 1 is a flowchart simply illustrating an extended current detecting method for controlling a three-phase motor in the event of employing an emergency brake according to an embodiment of the present invention, FIGS. 2A and 2B are views illustrating a current which flows in a three-phase motor in accordance with a brake situation according to an embodiment of the present invention, FIGS. 3A to 3F are views illustrating flowing of current in accordance with motor switching according to an embodiment of the present invention, and FIG. 4 is a block diagram simply illustrating an extended current detecting apparatus for controlling a three-phase motor in the event of employing an emergency brake according to an embodiment of the present invention.

Referring to FIGS. 1 to 4, in an extended current detecting method for controlling a three-phase motor in the event of employing an emergency brake according to an embodiment of the present invention, first, when a user urgently puts a brake pedal in order to perform emergency brake, the brake control unit 420 may obtain a braking force required by the user through a brake travel sensor 410. Here, the brake travel sensor 410 converts (generates) a braking force requested by the user into a pressure value to transmit the pressure value to an electronic brake control unit 420 in step S101.

When the pressure value is transmitted, the electronic brake control unit 420 compares a reference pressure value in accordance with an emergency brake detecting algorithm with the pressure value transmitted from the brake travel sensor 410 to determine whether to be in an emergency brake state in step S103. Here, the reference pressure value may be determined by a speed and a pressure at which when an emergency situation occurs, the user recognizes the situation and urgently puts the brake pedal. The reference pressure value includes an assistance pressure value prepared for a case when the user insufficiently puts the brake pedal.

When it is determined that the situation is not an emergency brake state by comparing the pressure value obtained from the brake travel sensor 410 with the reference pressure value, the electronic brake control unit 420 performs the control in a general vehicle brake mode (rated current control).

When it is determined that the situation is an emergency brake state by comparing the pressure value obtained from the brake travel sensor 410 with the reference pressure value, the electronic brake control unit 420 increases the pressure value to be a predetermined level or higher to generate a target pressure value in step S105. Here, the target pressure value is generated in order to temporally rapidly stop the vehicle in the emergency brake state.

Next, the electronic brake control unit 420 controls a pressure of a brake 440 so as to reach the target pressure value in step S107. Here, the electronic brake control unit 420 outputs a current corresponding to the target pressure value to a three-phase motor 430 and controls a pressure of the brake 440 so as to reach the target pressure value through a rotational force of the three-phase motor 430 by the current. Here, the current corresponding to the target pressure value is a current within a range which does not damage elements of a current sensor. Since the current sensor has a threshold value at which the current may actually pass, the current which is within a range in which the elements of the current sensor are not damaged may be referred as a maximum extended controllable current.

Next, the electronic brake control unit 420 controls the current which flows in the three-phase motor in order to control a torque of the three-phase motor in step S109. Here, the electronic brake control unit 420 detects current values from the phases of the three-phase motor and controls the current which flows in the three-phase motor using the detected current values. In this case, due to Y connection, a current of one phase of the three-phases of the motor is divided into remaining two phases or currents of remaining two phases are combined to flow into one phase and the three-phases may become a base which enables the Kirchhoff current law which will be described below.

Here, the electronic brake control unit 420 needs to detect a position of a rotor with respect to an electric rotational angle (electric angle) to flow a current appropriate for the position, in order to continuously rotate the three-phase motor 430 without having irregular rotation. In this case, in order to confirm the position of the rotor, a hall sensor and an encoder may be used. Even though it is possible to confirm an absolute position range of the rotor using the hall sensor, a resolution thereof is low. Even though a resolution of the encoder is high, it is difficult to confirm the initial absolute position of the rotor. Therefore, it is desirable to confirm the position of the rotor by using the hall sensor and the encoder together.

When the current value of the three-phase motor according to the embodiment of the present invention is detected first and an emergency brake state is on, the encoder and hall sensor 424 detect the electric angle of the three-phase motor 430. When the pressure of the brake 440 is exactly converged to the target pressure value which has been generated in advance and stabilized, the encoder and hall sensor 424 may measure a value of the electric angle corresponding to all of 0 to 360 degrees. Here, the electric angle of the three-phase motor 430 refers to an electric angle of a three-phase motor rotor.

The current sensor 421 detects a current value of a position corresponding to the electric angle of the three-phase motor 430 from at least two phases of the three-phase motor 430. By using FIGS. 2B and 3A as an example, a current value of a position corresponding to an electric angle of 30 degrees of the three-phase motor 430 is 100 A in an A phase, −200 A in a B phase, and 100 A in a C phase. Here, a negative value means a direction of the current.

A current sensor A and a current sensor B may located in the A phase and the B phase to detect current values from the phases. However, detection ranges of the current sensor A and the current sensor B according to the embodiment of the present invention are defined from −150 A to 150 A and the current sensor A and the current sensor B may not detect the current value of the B phase of −200 A. Accordingly, the current value of the B phase is detected as −150 A which is the threshold value and the electronic brake control unit 420 does not detect the increased current value as described above, so that the three-phase motor may not be correctly controlled. The method according to the embodiment of the present invention does not use the current value of the B phase from which −150 A corresponding to the threshold value is detected to control the three-phase motor.

The electronic brake control unit 420 compares the current values detected from the A phase and the B phase of the three-phase motor with the threshold value. When the current value detected from the B phase is equal to or higher than the threshold value, the electronic brake control unit 420 may obtain a current value for the remaining phase of the three-phase motor 430, that is, a current value for the C phase from a look-up table 423 which is defined in advance and determine a current value which is equal to or higher than the threshold value, that is, the current value of the B phase therethrough. Here, in the look-up table 423 which is defined in advance, current values by percentage of the three-phase motors A, B, and C which have been calculated for every electric angle in advance as illustrated in FIG. 2B are defined. The look-up table is stored in the memory.

The current value of the B phase may be determined in accordance with the Kirchhoff current law and for example, when the current value of the A phase is 100 A and the current value of the C phase is 100 A, the current value of the B phase may be determined as −200 A which is a current value at which the sum of current values of all phases becomes zero.

In contrast, referring to FIGS. 2B and 3C, FIG. 3C illustrates flow of a current when the electric angle of the three-phase motor 430 is 150 degree and the current sensor A and the current sensor B in this case may detect the current value of 100 A which is within a normal current detection range. When the electronic brake control unit 420 compares the current values detected from the A phase and the B phase with the threshold value and both the current values detected from the A phase and the B phase are lower than the threshold value, the electronic brake control unit 420 may determine the current value of the C phase in accordance with the Kirchhoff current law. Since the sum of the current values of the A phase and the B phase is 200 A, the current value of the C phase is determined as −200 A and thus the electronic brake control unit 420 may obtain current values of all phases of the three-phase motor.

Referring to FIG. 2B, for example, when the electronic brake control unit 420 compares the current values detected from the A phase and the B phase of the three-phase motor with the threshold value and both the current values detected from the A phase and the B phase are equal to or higher than the threshold value, the electronic brake control unit 420 adds a current value of a previous period to the detected current values of the A phase and the B phase and forcibly sets the current value of the remaining C phase as zero. In this case, the electric angle of the C phase is also forcibly set to be 60 degrees.

As another example, when the current values detected from the A phase and the B phase of the three-phase motor are within a predetermined dead zone (45 degrees to 60 degrees and 225 degrees to 240 degrees of FIG. 2B) in the electric angle range of the motor rotor, even though a current value which is equal to or higher than the threshold value is detected from the A phase and the B phase of the three-phase motor, the electronic brake control unit 420 does not ignore the value but adds an average of the current values of the previous period to the current values detected from the A phase and the B phase and sets the current value of the remaining C phase of the three-phase motor to be zero, to obtain current values of all phases.

The electronic brake control unit 420 controls the three-phase motor using the current value detected as described above in an extended current mode until the vehicle stops in step S111.

The electronic brake control unit 420 needs to check errors of the current and the pressure while operating in the extended current mode, in order to prevent erroneous detection due to malfunction of the current sensor 421. Here, it may be checked whether the current sensor 421 is broken through the pressure value generated by the three-phase motor, the pressure value of the brake travel sensor 410, and the electric angle of the three-phase motor.

In steps S113 and S115 of checking errors of the current and the pressure of the three-phase motor, it is checked whether a value obtained by subtracting the current value detected from the three-phase motor from a current value corresponding to the target pressure value satisfies zero and a value obtained by subtracting the pressure value generated from the three-phase motor from the target pressure value satisfies zero.

Meanwhile, the embodiments according to the present invention may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the embodiments have been described and illustrated in the drawings and the specification. The embodiments were chosen and described in order to explain certain principles of the invention and their practical application, to thereby enable others skilled in the art to make and utilize various embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A method of operating a motor-driven brake system of a vehicle, the method comprising:

providing a motor-driven brake system comprising a brake, a three-phase motor operably connected to the brake, the three-phase motor comprising a first phase, a second phase, a third phase, a first current sensor, a second current sensor, a rotor and a rotor position sensor configured to detect an electric angle of the rotor, the first current sensor configured to detect a current flowing in the first phase, the second current sensor configured to detect current flowing in the second phase, the first current sensor having a first range of measurable current the second current sensor having a second range of measurable current;

sensing a driver's input onto a brake pedal; and controlling operation of the motor-driven brake system based on the driver's input onto the brake pedal, wherein controlling comprises:

sensing a current flowing in the first phase using the first sensor and supplying a first current to the first phase based on the sensed current of the first phase when the sensed current of the first phase is within the first range, sensing a current flowing in the second phase using a second sensor supplying a second current to the second phase based on the sensed current of the second phase when the sensed current of the second phase is within the second range, determining, based on the driver's input onto the brake pedal, an emergency braking situation causing to flow a first emergency current in the first phase and a second emergency current in the second phase, subsequent to determining, sensing the first emergency current using the first sensor and the second emergency current using the second sensor at the same time, in which the second sensor outputs a value within the second range of measurable current of the second sensor whereas the first sensor outputs its saturation value being one limit of the first range, detecting an electrical angle of the rotor at the same time using the rotor position sensor, estimating the first emergency current that flows in the first phase and is outside the first range, based on the electrical angle of the rotor detected by the rotor position sensor and further based on the value of the second emergency current that is outputted from the second sensor and is within the second range, and supplying a corresponding current to the first phase based on the estimated first emergency current.

2. The method of claim 1, further comprising:

when the driver's input onto the brake pedal does not indicate an emergency braking situation, determining a current flowing the third phase of the three-phase motor in accordance with the Kirchhoff current law using the current detected by the first current sensor and the current detected by the second current sensor.

3. The method of claim 1, wherein the first emergency current is determined using a look-up table specifying current values corresponding to the electric angle of the rotor of the three-phase motor.

* * * * *